(12) United States Patent
Gao

(10) Patent No.: US 7,873,081 B1
(45) Date of Patent: Jan. 18, 2011

(54) COMPACT AND HIGH PERFORMANCE WAVELENGTH TUNABLE LASER

(76) Inventor: Peiliang Gao, 2676 Newhall St., #39, Santa Clara, CA (US) 95050

( * ) Notice: Subject to any disclaimer, the term of this patent is extended or adjusted under 35 U.S.C. 154(b) by 0 days.

(21) Appl. No.: 12/272,324

(22) Filed: Nov. 17, 2008

(51) Int. Cl.
*H01S 3/10* (2006.01)
(52) U.S. Cl. .............................. 372/20; 372/13; 372/21; 372/29.011; 372/70; 359/285; 385/7
(58) Field of Classification Search .................. 372/20, 372/13, 21, 29.011, 70; 359/285; 385/7
See application file for complete search history.

(56) References Cited

U.S. PATENT DOCUMENTS

| | | | | |
|---|---|---|---|---|
| 3,944,334 | A | | 3/1976 | Yano et al. |
| 3,953,107 | A | * | 4/1976 | Yano et al. .................. 359/308 |
| 4,052,121 | A | * | 10/1977 | Chang ......................... 359/314 |
| 4,217,036 | A | * | 8/1980 | Chang ......................... 359/286 |
| 4,720,177 | A | | 1/1988 | Chang |
| 5,052,004 | A | | 9/1991 | Gratze et al. |
| 5,329,397 | A | | 7/1994 | Chang |
| 5,451,787 | A | * | 9/1995 | Taylor ...................... 250/338.5 |
| 5,576,880 | A | * | 11/1996 | Chang ......................... 359/305 |
| 5,909,304 | A | * | 6/1999 | Chang ......................... 359/308 |
| 5,936,981 | A | | 8/1999 | Wada et al. |
| 6,424,451 | B1 | * | 7/2002 | Chang ......................... 359/308 |
| 6,587,255 | B2 | * | 7/2003 | Davidson et al. ............ 359/314 |
| 6,822,785 | B1 | | 11/2004 | Chu et al. |
| 6,930,819 | B2 | | 8/2005 | Chu |
| 7,057,799 | B2 | | 6/2006 | Chu |
| 7,197,208 | B2 | * | 3/2007 | Trutna et al. .................. 385/37 |
| 7,372,612 | B2 | * | 5/2008 | Chu ........................... 359/285 |
| 7,463,795 | B2 | * | 12/2008 | Tsunoda et al. ................ 385/7 |
| 7,538,929 | B2 | * | 5/2009 | Wasilousky ................ 359/285 |
| 2005/0175045 | A1 | * | 8/2005 | Paldus et al. .................. 372/20 |
| 2006/0050747 | A1 | * | 3/2006 | Trutna et al. .................. 372/20 |
| 2009/0284826 | A1 | * | 11/2009 | Langdon ..................... 359/308 |

OTHER PUBLICATIONS

Streifer, William et al., "Analysis of a Dye Laser Tuned by Acousto-Optic Filter", Applied Physics Letters, vol. 17, No. 8, Oct. 15, 1970, pp. 335-337.

Taylor, D.J. et al., "Electronic Tuning of a Dye Laser Using the Acousto-Optic Filter", Applied Physics Letters, vol. 19, No. 8, Oct. 15, 1971, pp. 269-271.

(Continued)

*Primary Examiner*—Tod T Van Roy
*Assistant Examiner*—Yuanda Zhang
(74) *Attorney, Agent, or Firm*—Aka Chan LLP

(57) ABSTRACT

A tunable laser cavity utilizes a dispersion compensated acousto-optic tunable filter. The wavelength accuracy and stability is achieved by a wavelength locker utilizing two separate intracavity light beams without the need to use beam splitters to significantly reduce the space typically needed by a conventional wavelength locker, and provide more stable operation and easy assembly. The acoustic optical tunable filter is constructed in such a way that two transducers are bonded on the same crystal opposite to each other to create two counter propagating acoustic waves. Dispersion occurs after the collimated light diffracted by the first acoustic wave and is compensated by the second acoustic wave traveling in the opposite direction. By using different laser gain mediums, acoustic wave driving frequencies and acousto-optical crystals, this invention can be used to make tunable lasers in wide range of optical wavelengths.

12 Claims, 4 Drawing Sheets

OTHER PUBLICATIONS

Wada, S. et al., "Electronically Tuned Ti-Sapphire Laser", Optics Letters, vol. 21, No. 10, ISSN 0146-9592, pp. 731-733, May 15, 1996.

Chang, I.C., "Noncollinear Acousto-Optic Filter with Large Angular Aperture", Applied Physics Letters, vol. 25, No. 7, Oct. 1, 1974, pp. 370-372.

* cited by examiner

COMPACT AND HIGH PERFORMANCE WAVELENGTH TUNABLE LASER

BACKGROUND OF THE INVENTION

The present invention relates to an apparatus and method of tuning and locking wavelength in a tunable laser. More particularly, this invention relates to a laser resonant cavity implemented with dispersion compensated acousto-optic tunable filter and wavelength-locking design by which the fast-tuning speed, stable wavelength, and power performance can be realized.

Most modern telecommunications systems are based on fiber optic transmission. The fiber optic networks offer both unprecedented capacity and the deployment flexibility needed to support a wide range of evolving and emerging broadband applications. Widely tunable lasers help to maximize existing fiber optic network resource. The ability to dynamically provision bandwidth provides the ability to move traffic from overcrowded channels to unused channels to meet the demands for Internet access. Tunable laser is also a key prerequisite as networks move towards full mesh-based optical networks where light paths can be set up and changed quickly and easily.

The main features of an ideal tunable laser for such applications can be summarized as follows: wide tuning range covering C and/or L band (about 1530 nanometers to about 1610 nanometers), small footprint, fast tuning speed (in submilliseconds) between any two ITU grids, long-term performance stability (over 25 years of operation), highly reliable under severe work conditions, low electrical power consumption, low cost, and high manufacturbility.

Market penetration of tunable lasers is inhibited by the limitations of existing tunable lasers. The current tunable laser systems can be classified into the three types: (1) systems that use mechanically movable intracavity elements such as diffraction gratings, prisms, etalons or MEMS (microelectromechanical systems) as the wavelength tuning elements; (2) systems with thermally tunable elements built into the cavity and wavelengths are selected through thermally heating or cooling the elements; and (3) systems employ nonmovable intracavity optical elements for tuning, which involves the use of magneto-optic, acousto-optic, and electro-optic elements to physically select the wavelength.

Tuning techniques that rely on mechanical adjustment of the angle of a grating or prism are very susceptible to the mechanical shock and vibration causing short-term and long-term performance instability. Therefore tunable lasers employing moving parts are not suitable for optical telecom applications. Thermal tuning is intrinsically slow, and therefore its applications are limited.

Among the technologies which are based on tuning wavelength physically, acousto-optic technology which has been used as tuning element due to its electronic tunability without moving parts, fast tuning speed, wide tuning ranges, and relative simplicity in implementation is a viable approach to meet the stringent requirements of tunable lasers for telecom applications as described above. By appropriately selecting the acousto-optical crystals and driving acoustic frequencies, a tunable laser can be designed for operation within a wide range of wavelength spectrum.

A problem with the existing design of tunable laser utilizing acousto-optic filter for application in fiber optic telecom network are: (1) unstable laser oscillating in Fabry-Perot type cavity due to uncompensated dispersion; (2) the configuration of wavelength locker makes it very difficult to assembly and was not miniaturized; (3) unstable wavelength locker performance.

To solve the problems in the prior art and to meet the requirements for fiber optic telecommunication as described above, a new design for a tunable laser system with improved performance, reliability, and manufacturability is needed.

BRIEF SUMMARY OF THE INVENTION

A tunable laser cavity utilizes a dispersion-compensated acousto-optic tunable filter. The wavelength accuracy and stability is achieved by a wavelength locker utilizing two separate intracavity light beams without the need to use beam splitters to significantly reduce the space typically needed by a conventional wavelength locker, and provide more stable operation and easy assembly. The acoustic optical tunable filter is constructed in such a way that two transducers are bonded on the same crystal opposite to each other to create two counter propagating acoustic waves. Dispersion occurs after the collimated light diffracted by the first acoustic wave and is compensated by the second acoustic wave traveling in the opposite direction. By using different laser gain mediums, acoustic wave driving frequencies and acousto-optical crystals, this invention can be used to make tunable lasers in wide range of optical wavelengths.

In particular, this invention provides a unique design and method to make tunable lasers for fiber optic telecom applications for which the submillisecond tuning speed, compactness, and high reliability under severe work environment are paramount. The configuration has the advantages of improved performance and simpler construction for easy assembly and volume production.

An aspect of the present invention is to provide a method and apparatus of a compact tunable laser with rapid tuning capability and stable wavelength and optical power performance.

An aspect of the present invention is to provide a compact, wavelength selectivity and locking, dispersion-compensated acousto-optic filter for stable laser oscillations in laser resonator cavity.

Another aspect of the present invention is to optimize the dispersion compensation varied due to manufacturing tolerances of the acousto-optic crystal and transducers by varying phase delays between two acoustic wave fields.

Another aspect of the present invention to provide a configuration of the wavelength locker for stable operation, easy assembly, and compactness by utilizing the two intracavity light beams from laser cavity without the need to use beam splitters.

A cost effective and easy-to-manufacture tunable laser system for use in fiber optic telecommunication networks and other applications with stringent requirements is realized.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
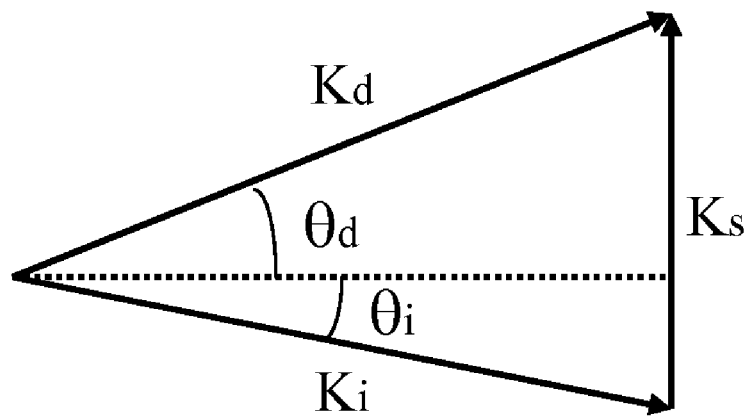
FIG. 1 is a diagram of wave vectors for illustrating the conditions of an acousto-optic Bragg grating filter.

FIG. 1 shows the wave vectors relationship between incident light beam, diffracted light beam, and acoustic waves in which $\kappa i \pm \kappa s = \kappa d$ is satisfied where "+" or "−" depends on the acoustic wave propagating direction. For the isotropic Bragg diffraction, $\kappa i = \kappa d$, $ni = nd$, $\theta i = \theta d$, $\sin \theta_B = \lambda/2n\lambda s = (\lambda/2n\upsilon s)fs$, in which ni and nd are the refractive index of incident beam and diffracted beam respectfully, $\upsilon s$ is the velocity of acoustic wave and fs is the acoustic frequency. For anisotropic Bragg diffraction, $\theta i \neq \theta d$, the following relation exists: $\sin \theta_i + \sin \theta d \approx (\lambda/2n\upsilon s)fs$, and $\lambda = \pm \upsilon s(nd-ni)/fs$.

For a fixed system where acoustic medium and incident beam angle do not change, the wavelength of the diffracted light beam can be changed by changing acoustic wave frequency. There are two basic types of tunable acousto-optic filters, collinear type and noncollinear type. The noncollinear type includes the isotropic Bragg diffraction type and far-off-axis anisotropic Bragg diffraction type. The far-off-axis anisotropic Bragg diffraction has more practical value due to its narrow bandwidth.

Figure 2:
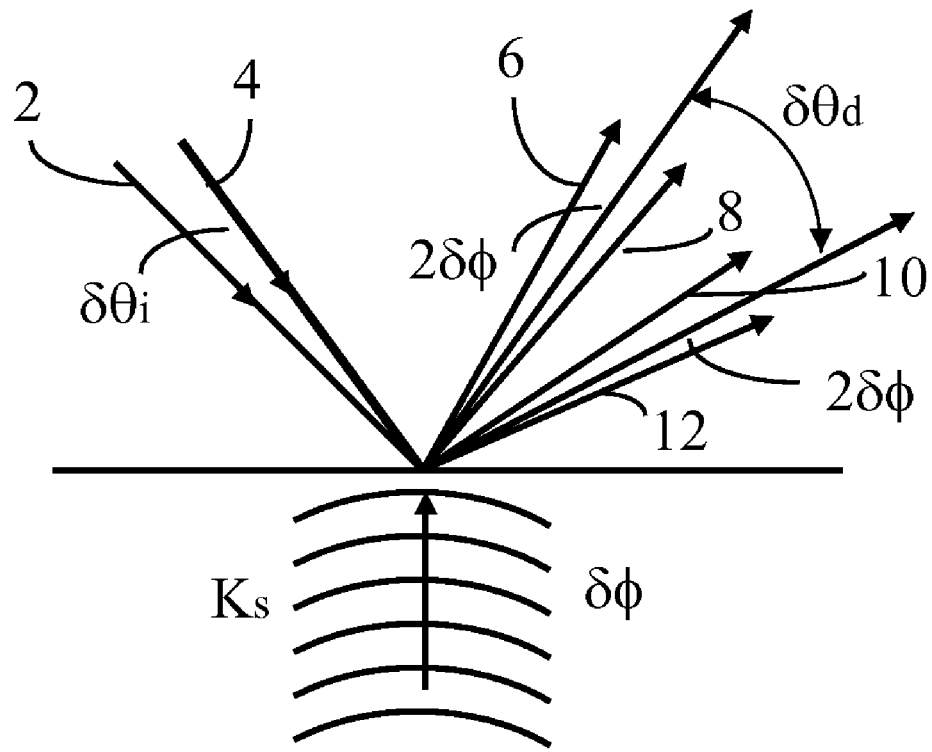
FIG. 2 is a conceptual diagram illustrating the dispersion of the diffracted lights due to the divergent incident light beam and divergent acoustic waves.

The dispersion exists in both types of diffraction as is shown in FIG. 2. Assuming the divergent angle of the incident light beam (i.e., beam 2 and 4) is $\delta\theta$; the divergent angle of the acoustic wave is $\delta\phi$, the relation between the divergent angle, wavelength, and beam width can be expressed as $\delta\theta \approx 2\lambda/\pi n\omega_o$; $\delta\phi \approx \lambda s/L$, where $\omega_o$ is the incident light beam waist radius, n is the refractive index of acousto-optic medium, and L is the width of acoustic wave.

For an incident light near Bragg angle, there is a diffracted light with divergent angle of $2\delta\phi$ (diffracted beam 6 and 8 corresponding to the incident beam 4, diffracted beam 10 and 12 corresponding to incident beam 2), which is caused by the divergent acoustic waves. For acoustic waves with the limited width, this dispersion exists and can be compensated by a counterpropagating acoustic wave with the same frequency and divergent angle. In practice, an adjustable phase shift for the compensating acoustic waves relative to the first acoustic wave is needed for optimization. The dispersion compensation by counter propagating acoustic waves was described in some of the published papers.

Figure 3:
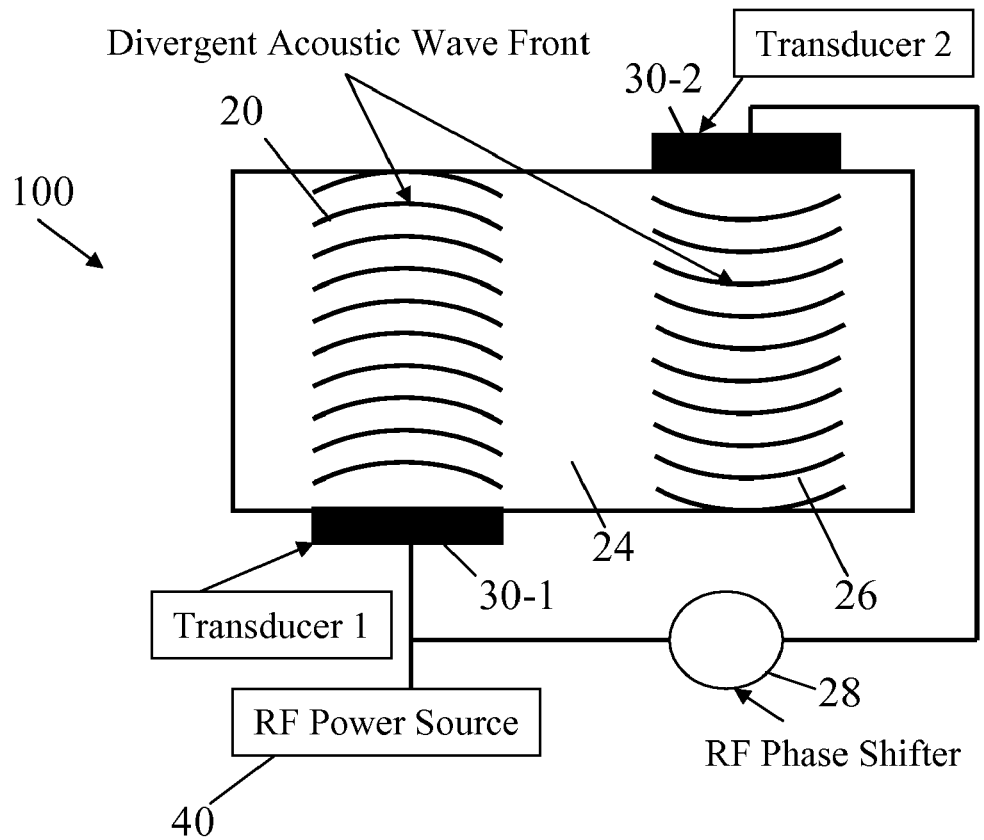
FIG. 3 is a schematic constitutional diagram of acousto-optic crystal with two transducers bonded opposite to each other without overlap as tunable filter.

Referring to FIG. 3 for an acousto-optic filter (AOTF) including a birefringent crystal substrate 24, such as tellurium dioxide or lithium niobate, and two transducers 30-1 and 30-2 (electromechanical or piezoelectric) bonded on the crystal substrate 24 opposite to each other.

The transducer may be implemented by a single transducer or an array of transducers. The transducers, which can be either longitudinal or shear, are connected to a suitable radio frequency signal source 40, such as a voltage-controlled oscillator, the frequency and amplitude of which can be varied. In response to received RF signal, the transducers generate acoustic waves in the birefringent crystal at an acoustic frequency corresponding to the frequency of the RF drive signals.

Transducer 30-2 is connected to the radio frequency signal source 40 through a RF phase shifter 28 for dispersion compensation optimization. Two transducers may also be driven by two separate RF generators each with the same frequency or slightly different frequencies with individually controlled phase shift. In a specific implementation, it is desirable that the frequency of the first source of radio frequency and the frequency of the second source of radio frequency are substantially the same.

Figure 4:
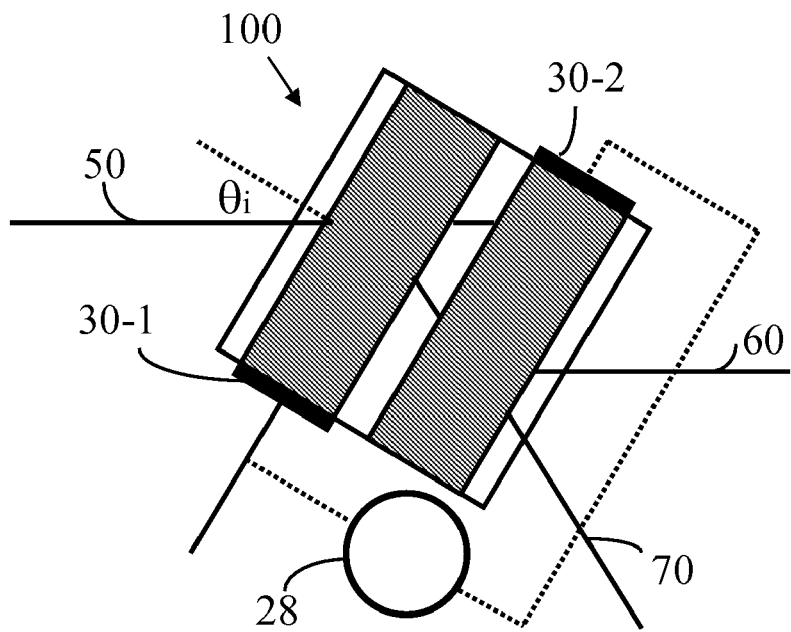
FIG. 4 shows the light Bragg diffractions by the acousto-optic crystal filter.

The use of AOTF 100 as tunable filter in a laser system is illustrated in FIG. 4. The incident light beam 50 at approximately Bragg angle $\theta i$ relative to the acoustic wave front 20 is diffracted by the first acoustic wave 20 to zero order beam 55 and first order beam 70, which is further diffracted by the second acoustic wave 26 to beam 60 and 70 (the first order and zero order by the second acoustic wave respectively). The configuration of the filter provides another intracavity beam 70 for use as one of the wavelength locker beams.

Figure 5:
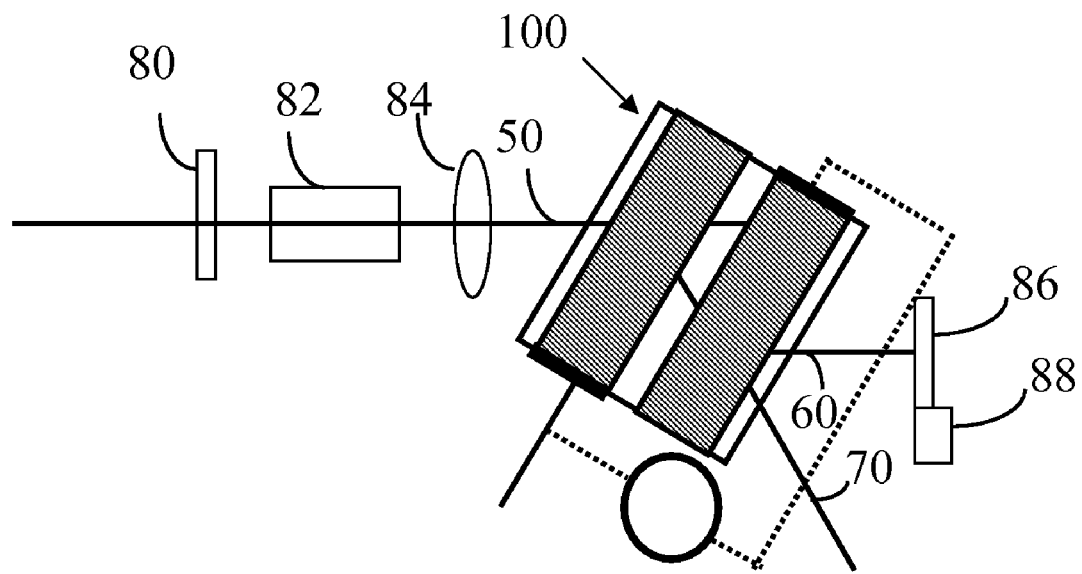
FIG. 5 is a block diagram of an embodiment of wavelength tunable laser.

Referring to FIG. 5 for a laser cavity consisting of a partial reflection mirror 80 with prescribed reflectivity or transmitivity (for instance, the mirror reflects 98 percent of the light inputted, while transmits 2 percent of the light) on the outgoing side and a total reflection mirror 86 (100 percent reflection).

Laser mirrors usually do not reflect all wavelengths or colors of light equally well—their reflectivity is matched to the wavelength bandwidth within which the laser operates. The purpose of the mirrors is to provide what is described as "positive feedback."

Reflective optical coatings may be directly applied to the laser medium itself as is usually the case in semiconductor gain medium. Fabry-Perot cavity or plane-parallel cavity with flat mirrors, which is also called "marginal stable laser cavity," produces a flat zigzag light path, but as discussed above, this type of cavity is very sensitive to mechanical disturbances and walk-off.

Two other types of laser cavities are called unstable cavity and stable cavity, typically using convex and concave mirrors or combination with plane mirrors respectively. In practice, different cavity designs and operating conditions are used to produce different output power level and lasing modes for different applications.

Laser medium 82 is positioned between two mirrors as indicated in FIG. 5. This means simply that some of the light that emerges from the amplifying medium is reflected back into it for further amplification. The optical gain medium may be any type of optical gain medium that is configured to amplify light oscillating along the optical path 50 and 60.

In the illustrated embodiment for telecommunication applications, the optical gain medium is a semiconductor amplifier, which amplifies light by optically stimulated recombination of holes and electrons in a PN junction. The light emitted from the semiconductor amplifier is characterized by a finite spread of photon energy centered close to the band gap energy of the active region material of the semiconductor amplifier.

A collimating lens 84 transforms the diverging optical beam from the laser gain medium into a collimated optical beam 50. This is important to reduce the incident beam divergence because the divergence of the diffracted beam by the filter is directly affected by the divergence of incident beam as discussed above.

The wavelength selecting acousto-optic filter 100 is positioned between the collimating lens 84 and the end reflection mirror 86. The wavelength is selected for oscillating inside laser cavity by changing the RF frequency and moving mirror 86 along the cavity beam 60 by piezoelectric transducer (PZT) base 88. The PZT may use lead zirconate titanate, which is a piezoelectric ceramic material.

Referring to FIG. 5, in one embodiment, the mirror 86 is typically a total reflection mirror for the laser operational spectrum range. This is the conventional design for a laser cavity with one partial reflection mirror as the laser output mirror and another mirror with total reflection, which is attached to the PZT base 88 for moving the mirror for lasing phase matching at different wavelengths.

Figure 6:
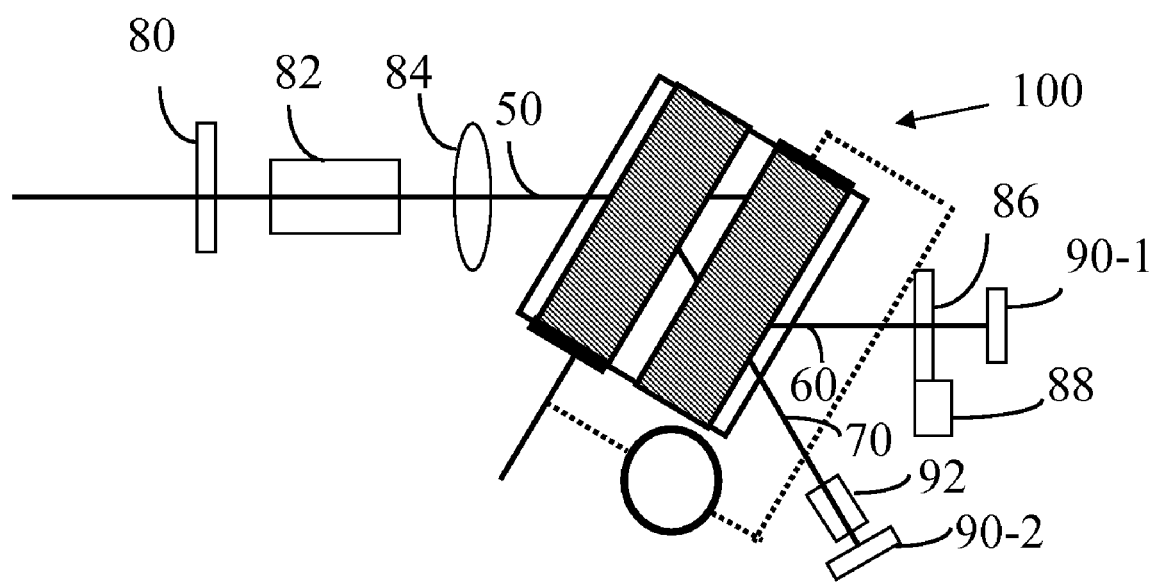
FIG. 6 is a block diagram of an embodiment of wavelength tunable laser with a wavelength locker.

Referring to FIG. 6 for the same laser cavity of FIG. 5 where total reflection mirror 86 is replaced by a partial reflection mirror of high reflectivity (for instance, 99 percent). The reflectivity of mirror 86 should not be lower than 95 percent to minimize the laser cavity loss. This configuration will slightly increase the cavity loss, but has an advantage to construct a wavelength locker by two intracavity beams 60 and 70.

By increasing the reflectivity of the partial reflection mirror 80, the extra cavity loss due to the partial reflection mirror 86 can be compensated so that the total cavity loss is kept the same as the cavity depicted in FIG. 5. The wavelength locker consists of photo detector 90-1 and 90-2, and a low finesse etalon 92.

Figure 7:
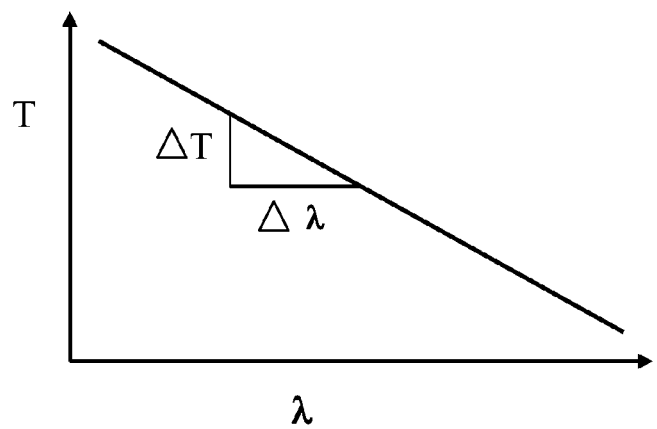
FIG. 7 shows the linear relation between transmission and wavelength by a low finesse etalon for wavelength locking purpose.

FIG. 7 shows the relation between the wavelength and etalon's transmission rate (T). The relation between transmitted power from etalon and wavelength can be expressed as $\lambda=\alpha T+\beta$, where $\alpha$ and $\beta$ are the constants determined by the etalon's finesse using the linear approximation. Term $\alpha$ can be designed according to the application, tuning wavelength range, and resolution required for wavelength locking.

Since the received power is directly proportional to the transmission rate T, the relation between the $\lambda$ and received power (P) can be expressed as $\lambda=\alpha P+\beta$, which can be further expressed as: $\Delta\lambda=\alpha\Delta P$ assuming laser cavity power change is detected by photo detector 90-1 and the laser power doesn't change. Therefore, the power change ($\Delta P$) received by photo detector 90-2 is completely caused by the wavelength change ($\Delta\lambda$).

Figure 8:
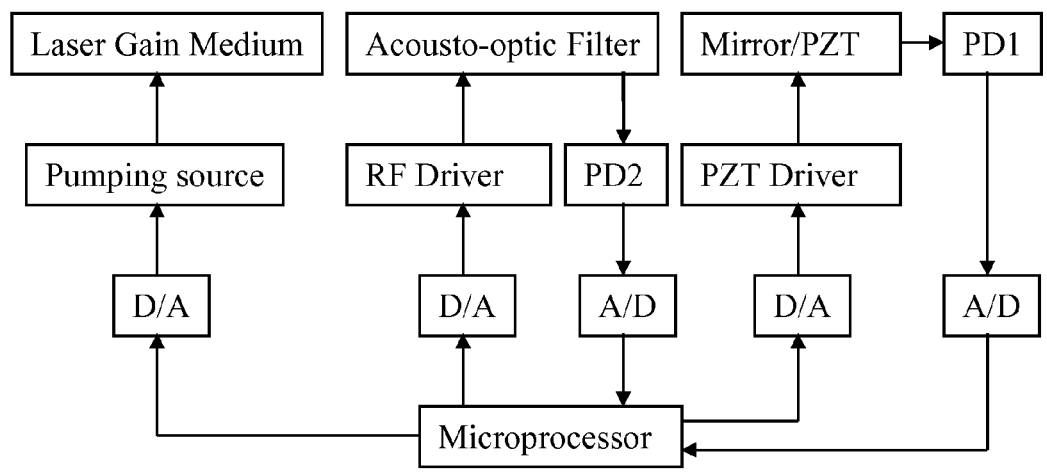
FIG. 8 is a functional block diagram of the laser system with feedback control loops.

This information is used to feedback to the radio frequency driver and PZT driver to make the corresponding changes to pull the wavelength back to the prescribed wavelength by changing the RF signal frequency and adjusting mirror position and therefore to stabilize the laser oscillating wavelength. In normal laser operation, the laser power can be monitored accurately by photo detector 90-1. This information can be used to monitor and maintain the laser output power through a feedback control loop. FIG. 8 shows functional control and feedback loops for such a laser system.

The invention of this configuration utilizing two intracavity beams has several advantages over the conventional configuration:

(1) Compactness. It is clear from FIG. 6 that it is more compact than in the prior art. In practice, the photo detector 90-1 can be bonded to the mirror 86 for easy assembly.

(2) Lower cost. Only three components are needed, an etalon 92 and two photo detectors 90-1 and 90-2. No beam splitter or other component is needed.

(3) Easy assembly. Since two photo detectors can be assembled separately, it reduces interdependency of optical alignment of the components, and therefore, reduces the assembly complexity, and provides more tolerances for each component.

(4) More reliable and stable performance. Due to the advantages described above, the configuration is less susceptible to the mechanical disturbances and stresses.

Figure 9:
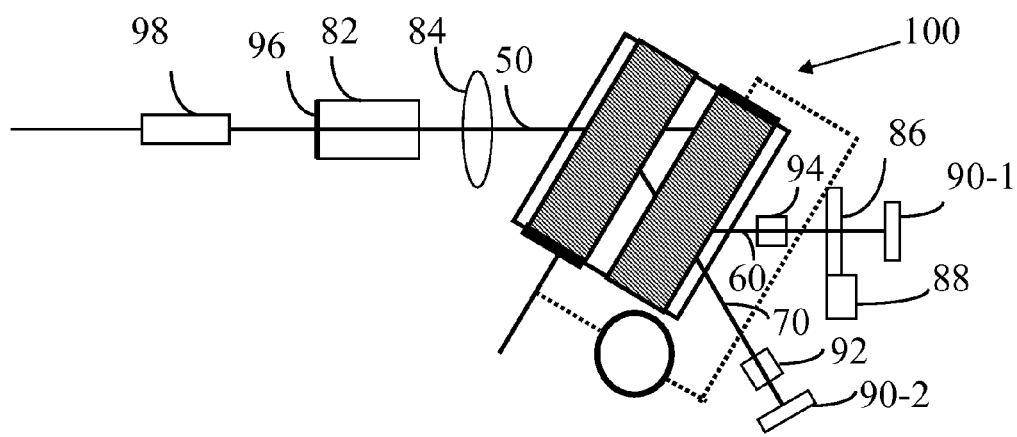
FIG. 9 is a block diagram of an embodiment of tunable laser with a pigtail typically used for fiber optical telecommunication.

In order to use the tunable laser depicted in FIG. 6 for fiber optical telecommunication application, there are a couple of components needed, cavity etalon 94 designed to operate at ITU grid (i.e., 25-gigahertz, 50-gigahertz, and 100-gigahertz laser oscillation frequency peak spacing) and a pigtailed collimator 98 to couple the laser output beam into a fiber as shown in FIG. 9. Typically, the collimator 98 uses PM (polarization maintaining) fiber.

The output mirror 80 is replaced with the reflective coatings 96 directly applied to the semiconductor gain medium.

For fiber optical telecommunication in C and L band (wavelength between about 1530 nanometers to about 1610 nanometers), the tunable filter 100 utilizes noncollinear far-off-axis anisotropic Bragg diffraction. The most significant feature of the noncollinear acousto-optic filter is that a narrow filter band pass can be maintained for a relatively large cone of incident light. As a matter of preference and not of limitation, the crystal is made of telluride oxide (TeO2) which has an extremely low acoustic velocity, in addition to its other desired properties (i.e., acoustically anisotropic and optically birefringent).

Telluride oxide has an extremely large figure of merit that results in reduced power need and the transverse configuration allows an extended acoustic path, and thereby can be used to achieve larger aperture without increase of drive power. LiNbO3 crystal is another choice for such as application. In an embodiment, the far-off-axis anisotropic Bragg diffraction is generated above a certain frequency and the incident angle increases abruptly to generate wavelength filtering. For a narrow band filter application, this type of Bragg diffraction can be used.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A wavelength tunable laser comprising:
(a) an output mirror and an end mirror each having prescribed reflectivity to form a laser cavity;
(b) a wavelength tunable laser medium disposed in said laser cavity and capable of laser oscillation in a wavelength spectrum of a prescribed range;
(c) an acousto-optical filter disposed in the said laser cavity and to which is inputted the outgoing light from said wavelength tunable laser medium by a collimating lens; said filter comprising an acoustically anisotropic and optically birefringent crystal; means for exciting an acoustic wave in said crystal comprising a first acoustical transducer and second acoustical transducer bonded opposite to each other to selected surfaces of said crystal, a first and second acousto-optical diffraction means are formed as a first acoustic field and second acoustic field counter propagating in a single acousto-optical crystal for optical dispersion compensation and wavelength shift compensation;

(d) said acousto-optical filter, said output mirror and said end mirror of said laser cavity being arranged so as to reflect only a light component which is diffracted by said acousto-optical filter;

(e) a source of radio frequency electrical power for providing radio frequency energy to said transducers for tuning the cavity oscillation wavelength by changing the radio frequency;

(f) a radio frequency signal phase delay line capable of adjusting the two radio frequency signal phases by 0 to 180 degrees;

(g) means for exciting said laser gain medium;

(h) a base for the said cavity end mirror attached to a PZT element;

(i) a PZT driver to activate said PZT element; and (j) an intracavity collimating lens for collimating laser beam inputting to said filter.

2. The wavelength tunable laser of claim 1 wherein said acousto-optic filter is disposed approximately at the Bragg angle relative to the laser beam and are maintained at approximately the Bragg angle for different wavelengths of laser beam.

3. The wavelength tunable laser of claim 1 wherein said outgoing mirror and end mirror can be flat or concave or convex or combination of any two types to form different types of laser cavity, said output mirror has partial reflectivity and said return mirror has 100 percent reflectivity.

4. A wavelength tunable laser of claim 1 further comprising:

(k) a wavelength locker consisting of an etalon and photo detectors of the prescribed wavelength;

(l) an electronic signal processing unit connected to a first and a second photo detector for processing the received optical power respectively;

(m) a closed feedback loop signal control unit for changing the radio frequency and driving PZT to lock the oscillating wavelength; and (n) a total reflection return mirror is replaced by a partial reflection return mirror.

5. The wavelength tunable laser of claim 4 wherein said wavelength locker having first photo detector disposed outside of said cavity behind said return mirror, said wavelength locker etalon disposed outside of said cavity to which inputted the intracavity beam from said filter and second photo detector disposed outside of said cavity receiving laser beam transmitted from said return mirror.

6. The wavelength tunable laser of claim 4 wherein said laser cavity comprising a partial reflection output mirror and a partial reflection return mirror.

7. A wavelength tunable laser of claim 4 further comprising:

(o) a lens disposed outside of said cavity to collimate the laser beam outputted from said output mirror to a collimator;

(p) an etalon disposed in the said laser cavity with prescribed optical transmission characteristics aligned with the International telecommunication (ITU) frequency spacing grids to narrow the lasing bandwidth and increase the side mode suppression ratio; and (q) a coupling collimator with pigtailed optical fiber for receiving the said output laser beam from the said laser cavity for fiber optical telecommunication application.

8. The wavelength tunable laser of claim 7 wherein said collimator is a single mode, polarization maintaining (PM) fiber.

9. The wavelength tunable laser of claim 7 wherein said etalon having optical transmission characteristics of peaks at 25 gigahertz, 50 gigahertz, or 100 gigahertz.

10. The wavelength tunable laser of claim 7 wherein said first and second acoustic optical diffraction means are formed as the first and second field respectively by Lithium Niobate (LiNbO3) crystal.

11. The wavelength tunable laser of claim 7 wherein said first and said second acoustic optical diffraction means are formed as the first and second field respectively by Tellurite Oxide (TeO2) crystal.

12. The wavelength tunable laser of claim 7 wherein said output mirror is replaced by a partial reflection coating directly coated on the said semiconductor gain medium.

* * * * *